US009222978B2

(12) United States Patent
Huang et al.

(10) Patent No.: US 9,222,978 B2
(45) Date of Patent: Dec. 29, 2015

(54) TWO-DIMENSIONAL SCAN ARCHITECTURE

(75) Inventors: Yu Huang, Sudbury, MA (US); Wu-Tung Cheng, Lake Oswego, OR (US); Ruifeng Guo, Portland, OR (US); Manish Sharma, Wilsonville, OR (US); Liyang Lai, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 292 days.

(21) Appl. No.: 13/416,912

(22) Filed: Mar. 9, 2012

(65) Prior Publication Data

US 2012/0233512 A1    Sep. 13, 2012

Related U.S. Application Data

(60) Provisional application No. 61/450,950, filed on Mar. 9, 2011.

(51) Int. Cl.
*G01R 31/28* (2006.01)
*G01R 31/3185* (2006.01)

(52) U.S. Cl.
CPC *G01R 31/318536* (2013.01); *G01R 31/318544* (2013.01)

(58) Field of Classification Search
CPC ............. G01R 31/318547; G01R 31/318544; G01R 31/318566; G01R 31/318536; G11C 29/40; G11C 29/48; G11C 29/12; G06F 11/27; G06F 11/3652
USPC .................................. 714/726, 729, 733, 734
See application file for complete search history.

(56) References Cited

U.S. PATENT DOCUMENTS

| 5,504,756 | A  | * | 4/1996  | Kim et al. ....................... 714/729 |
|-----------|----|---|---------|---------------------------------------------|
| 6,829,740 | B2 | * | 12/2004 | Rajski et al. ................... 714/729 |
| 6,961,886 | B2 | * | 11/2005 | Motika et al. .................. 714/732 |
| 7,568,139 | B2 | * | 7/2009  | Dokken et al. ................. 714/726 |
| 8,166,359 | B2 | * | 4/2012  | Rajski et al. ................... 714/732 |
| 2003/0188246 | A1 | | 10/2003 | Rearick et al. |
| 2003/0204350 | A1 | | 10/2003 | Rearick et al. |
| 2004/0190331 | A1 | | 9/2004  | Ross et al. |
| 2004/0204895 | A1 | | 10/2004 | Rearick et al. |
| 2005/0081130 | A1 | | 4/2005  | Rinderknecht et al. |
| 2005/0222816 | A1 | | 10/2005 | Cheng et al. |
| 2005/0240848 | A1 | * | 10/2005 | Cote et al. ..................... 714/726 |

(Continued)

OTHER PUBLICATIONS

I. Bayraktaroglu and A. Orailoglu, "The construction of optimal deterministic partitioning in scan-based BIST fault diagnosis: mathematical foundations and cost-effective implementations," TCAD 2005, pp. 61-75.

(Continued)

*Primary Examiner* — Christine Tu
(74) *Attorney, Agent, or Firm* — Klarquist Sparkman, LLP (57) ABSTRACT

Aspects of the invention relate to techniques of using two-dimensional scan architecture for testing and diagnosis. A two-dimensional scan cell network may be constructed by coupling input for each scan cell to outputs for two or more other scan cells and/or primary inputs through a multiplexer. To test and diagnose the two-dimensional scan cell network, the two-dimensional scan cell network may be loaded with chain patterns and unloaded with corresponding chain test data along two or more sets of scan paths. Based on the chain test data, one or more defective scan cells or defective scan cell candidates may be determined.

13 Claims, 11 Drawing Sheets

200

(56) References Cited

U.S. PATENT DOCUMENTS

| | | |
|---|---|---|
| 2006/0053357 A1 | 3/2006 | Rajski et al. |
| 2006/0066338 A1 | 3/2006 | Rajski et al. |
| 2006/0066339 A1 | 3/2006 | Rajski et al. |
| 2006/0111873 A1 | 5/2006 | Huang et al. |
| 2006/0156144 A1 | 7/2006 | Cheng et al. |
| 2007/0011542 A1 | 1/2007 | Mukherjee et al. |
| 2007/0038911 A1 | 2/2007 | Koenemann et al. |
| 2007/0100586 A1 | 5/2007 | Cheng et al. |
| 2007/0220381 A1 | 9/2007 | Huang et al. |
| 2007/0226570 A1 | 9/2007 | Zou et al. |
| 2007/0283202 A1 | 12/2007 | Cheng et al. |
| 2008/0040637 A1 | 2/2008 | Huang et al. |
| 2008/0111558 A1 | 5/2008 | Sharma et al. |
| 2008/0201670 A1 | 8/2008 | Rinderknecht et al. |
| 2008/0215943 A1 | 9/2008 | Guo et al. |
| 2008/0235544 A1 | 9/2008 | Lai et al. |
| 2008/0250284 A1 | 10/2008 | Guo et al. |
| 2009/0172486 A1 | 7/2009 | Ross et al. |
| 2009/0177936 A1 | 7/2009 | Koenemann et al. |
| 2009/0235134 A1 | 9/2009 | Guo et al. |
| 2009/0254786 A1 | 10/2009 | Cheng et al. |
| 2010/0293422 A1 | 11/2010 | Huang et al. |
| 2010/0306606 A1 | 12/2010 | Huang et al. |
| 2011/0035638 A1 | 2/2011 | Guo |
| 2012/0239995 A1* | 9/2012 | Gizdarski ............ 714/729 |

OTHER PUBLICATIONS

D.K. Bhaysar, U. Echeruo, D.R. Akeson, W.J. Bowhill, "A Highly Testable and Diagnosable Fabrication Process Test Chip", ITC, 1998, pp. 853-861.

R. Guo, L. Lai, Y. Huang and W.-T. Cheng, "Detection and Diagnosis of Static Scan Cell Internal Defect", ITC, 2008, Paper 17.2.

C. Hess, "Device Array Scribe Characterization Vehicle Test Chip for Ultra Fast Product Wafer Variability Monitoring", International Conference on Microelectronic Test Structures, 2007, pp. 145-149.

M. Karthikeyan, et al. "Short-flow test chip utilizing fast testing for defect density monitoring in 45nm", International Conference on Microelectronic Test Structures, 2008, pp. 56-61.

J. Rajski and J. Tyszer, "Diagnosis of scan cells in BIST environment," TCAD 1999, pp. 724-731.

F. Yang, S. Chakravarty, N. Devta-Prasanna, S.M. Reddy and I. Pomeranz, "On the Detectability of Scan Chain Internal Faults—An Industrial Case Study", IEEE VLSI Test Symposium, 2008, pp. 79-84.

* cited by examiner

TWO-DIMENSIONAL SCAN ARCHITECTURE

RELATED APPLICATIONS

This application claims priority to U.S. Provisional Patent Application No. 61/450,950, entitled "Two-Dimensional Scan Architecture For Test Chips," filed on Mar. 9, 2011, and naming Yu Huang et al. as inventors, which application is incorporated entirely herein by reference.

FIELD OF THE INVENTION

The present invention relates to the field of integrated circuit (IC) testing technology. Various implementations of the invention may be particularly useful for using two-dimensional scan architecture for testing and diagnosis.

BACKGROUND OF THE INVENTION

Building circuits on real chips as test chips can provide insight into how a new fabrication process works. Traditionally, semiconductor manufacturers relied mainly on SRAM (static random-access memory) test chips for ramping up, qualifying and monitoring new semiconductor fabrication processes. The transistor and circuit geometries used on an SRAM test chip, however, represent only a small fraction of the transistor and circuit geometries found in a real product. In recent years, test chips with logic circuit components (logic test chips hereinafter) are often utilized to supplement or replace SRAM test chips. While more closely representing chips with real circuit designs, the logic test chips are not as easily testable or diagnosable as the SRAM test chips.

To check whether a logic test chip is fabricated according to the design and to locate potential defects, scan chains formed by scan cells may be inserted into these circuit designs. Using the scan chains, scan-based testing and diagnosis are performed. Because the scan chains themselves may be defective due to systematic or random manufacturing variations, the integrity of scan chains needs to be checked first before testing the circuit under test.

Scan chains and scan cells are built with logic circuit components and thus may contain transistor and circuit geometries needed for test chips. Moreover, the functionality of a logic test chip is usually not a concern. Therefore, a logic test chip may be constructed mainly with scan chains. Testing such a logic test chip then becomes testing scan cells and their interconnections.

BRIEF SUMMARY OF THE INVENTION

Aspects of the invention relate to techniques of using two-dimensional scan architecture for testing and diagnosis. With various implementations of the invention, a two-dimensional scan cell network may be constructed by coupling input for each of core scan cells to outputs for two or more scan cells through a multiplexer. A core scan cell is a scan cell of which input is not coupled to a primary input. In some embodiments of the invention, the multiplexer is a 2-to-1 multiplexer. In some other embodiments of the invention, the multiplexer is a 4-to-1 multiplexer.

To test and diagnose the two-dimensional scan cell network, the two-dimensional scan cell network may be loaded with chain patterns and unloaded with corresponding chain test data along two or more sets of scan paths. Each of the two or more sets of scan paths may be constructed by selecting a particular input signal for each of the scan cells in the two-dimensional scan cell network. Two simple orthogonal sets of scan paths are formed by horizontal scan paths and vertical scan paths, respectively. A set of quasi-diagonal scan paths and/or a set of reverse scan paths may also be constructed. Based on the chain test data, one or more defective scan cells or defective scan cell candidates may be determined.

DETAILED DESCRIPTION OF THE INVENTION

General Considerations

Various aspects of the present invention relate to using two-dimensional scan architecture for testing and diagnosis. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "load/unload," "locate," "determine," "identify," and "perform" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Two-Dimensional Scan Architecture

Figure 1A:
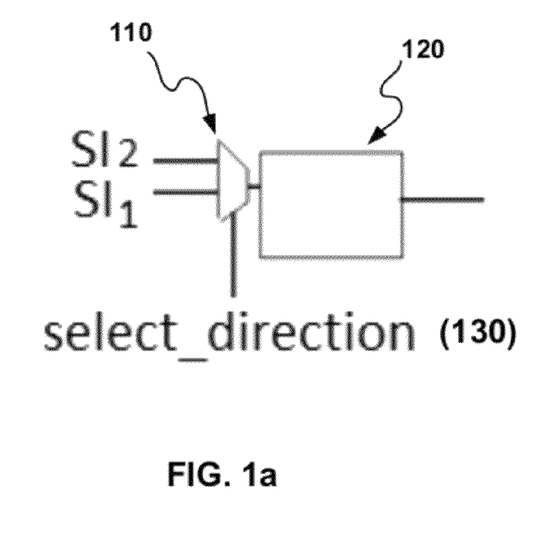
FIG. 1a illustrates an example of a 2-to 1 multiplexer placed in front of the input of a scan cell.

Conventional scan architectures connect scan cells into one-dimensional scan chains. Test pattern data and test response data are shifted into and out of scan chains, respectively, along these scan chains—fixed scan paths. Various embodiments of the invention employ two-dimensional scan architectures that arrange scan cells into two-dimensional scan cell networks. In a two-dimensional scan cell network, input for each scan cell is coupled to outputs for two or more other scan cells and/or primary inputs. This coupling may be implemented with a multiplexer. FIG. 1a illustrates an example of a 2-to 1 multiplexer 110 placed in front of the input of a scan cell 120. $SI_1$ and $SI_2$ are two inputs of the multiplexer 110 that can be coupled to outputs of two other scan cells, one output of another scan cell and a primary input, or two primary inputs. The selector 130 of the multiplexer 110 is used to determine which input, $SI_1$ or $SI_2$, provides signal to be latched into the scan cell 120. A primary input may provide a selection signal to the selector 130.

Figure 1B:
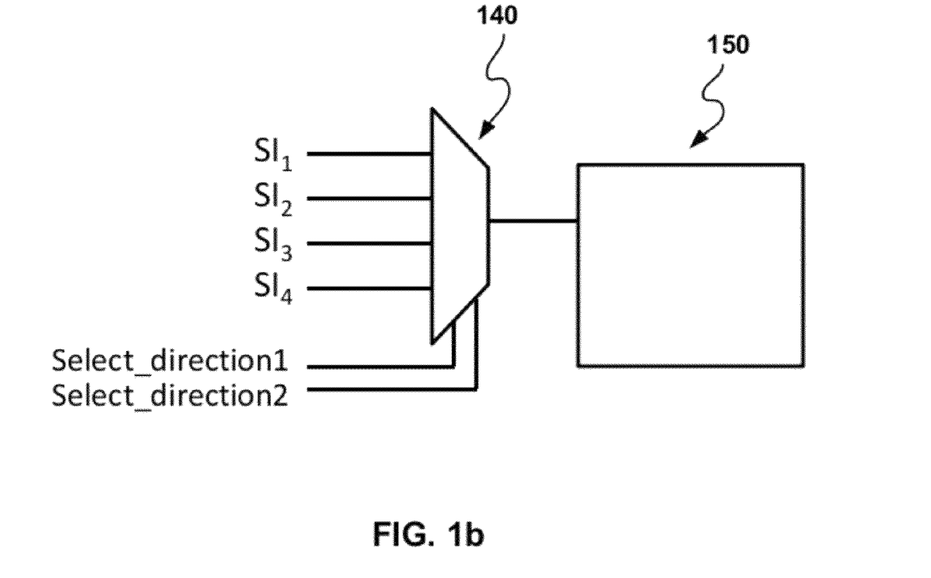
FIG. 1b illustrates an example of a 4-to 1 multiplexer placed in front of the input of a scan cell.

To construct a more complicated two-dimensional scan cell network, a multiplexer with more than two inputs may be employed. FIG. 1b illustrates an example of a 4-to-1 multiplexer 140 coupled to a scan cell 150. The 4-to-1 multiplexer 140 allows, for example, the scan cell 150 to accept data from one of three other scan cells.

Figure 2:
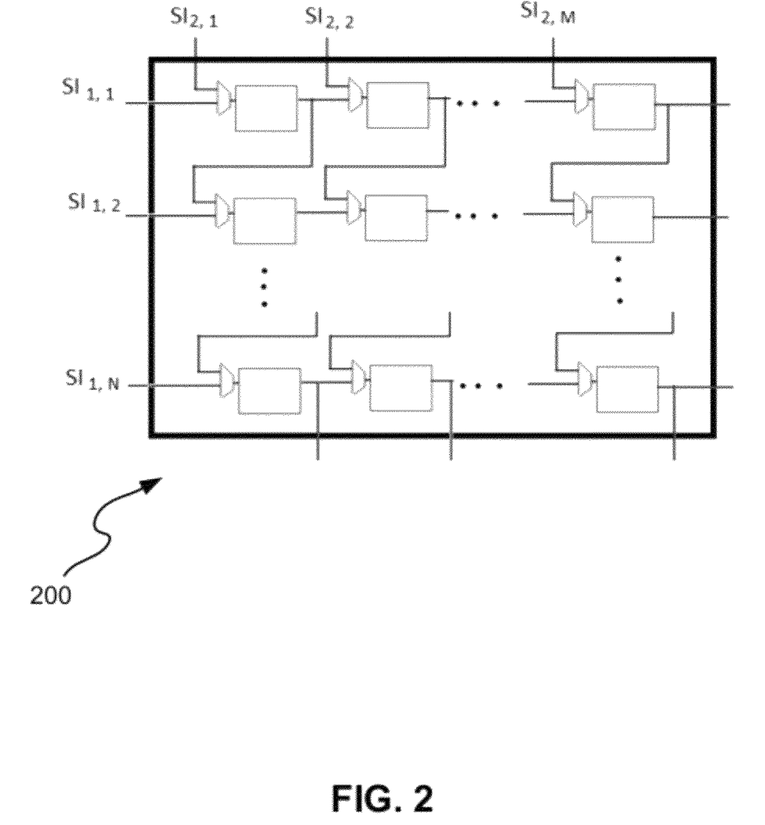
FIG. 2 illustrates an example of a two-dimensional scan cell network 200 constructed using 2-to-1 multiplexers.
Figure 6:
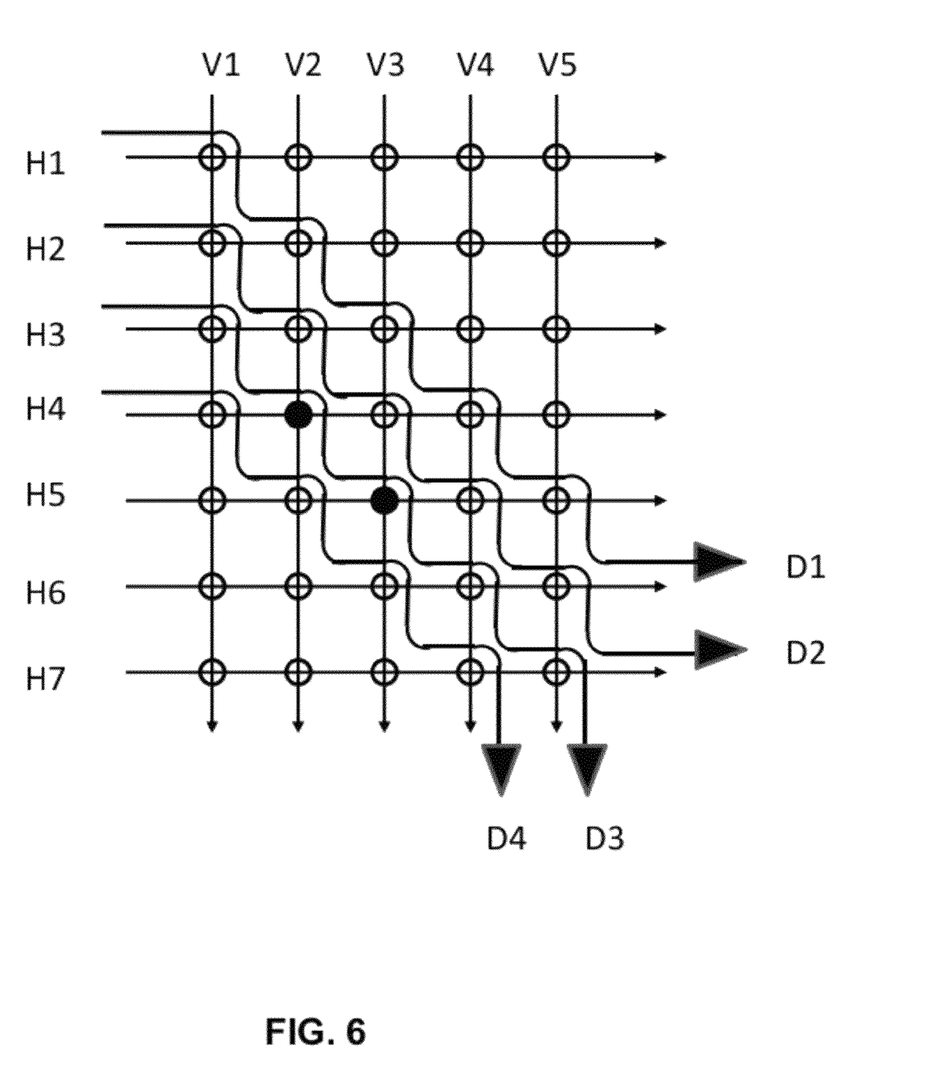
FIG. 6 illustrates an example of a set of quasi-diagonal scan paths for scan chain diagnosis.

FIG. 2 illustrates an example of a two-dimensional scan cell network 200 constructed using 2-to-1 multiplexers. The two-dimensional scan cell network 200 can work as a set of parallel one-dimensional scan chains (accepting signals from primary inputs $SI_{1,1}, SI_{1,2}, \ldots SI_{1,N}$, and shifting from left to right) when the selectors for the multiplexers are all set to be "0." Another set of parallel one-dimensional scan chains (accepting signals from primary inputs $SI_{2,1}, SI_{2,2}, \ldots SI_{2,N}$, and shifting from top to bottom) can be formed by setting the selectors to be "1." The scan paths for these two configurations of scan chains are perpendicular to each other, referred to hereinafter as parallel and perpendicular scan paths, respectively. If some of the selectors are set to be "0" while the others are set to be "1," more complex scan chains and thus scan paths may be constructed. One example is illustrated in FIG. 6, which will be discussed in detail below.

If the number of I/O pins of a test circuit is small, the scan input pins at left side $S_{1,1}, SI_{1,2}, \ldots SI_{1,N}$ in FIG. 2 can share with the scan input pins at the top $SI_{2,1}, SI_{2,2}, \ldots SI_{2,N}$ because within each shift cycle, only one shift direction is used. The scan-input pin sharing can be controlled by the selectors for the corresponding multiplexers. Similar arrangement can be made for the scan-output pins.

To reduce the total number of scan input and output pins, some implementations of the invention organize scan cells into an array that is or close to a square.

Two-Dimensional Scan Architecture Testing And Diagnosis

Traditionally, scan chains are tested with chain patterns. When they are applied, these chain patterns are shifted all the way through scan chains. No launch/capture operations are performed. By comparing the unloaded chain patterns with the original chain patterns, faulty scan chains and fault models may be determined. Scan chain diagnosis, however, is more challenging. To identify defective scan cells, scan patterns (test patterns primarily used for testing and diagnosing a circuit under test) may be needed in many situations.

Figure 3:
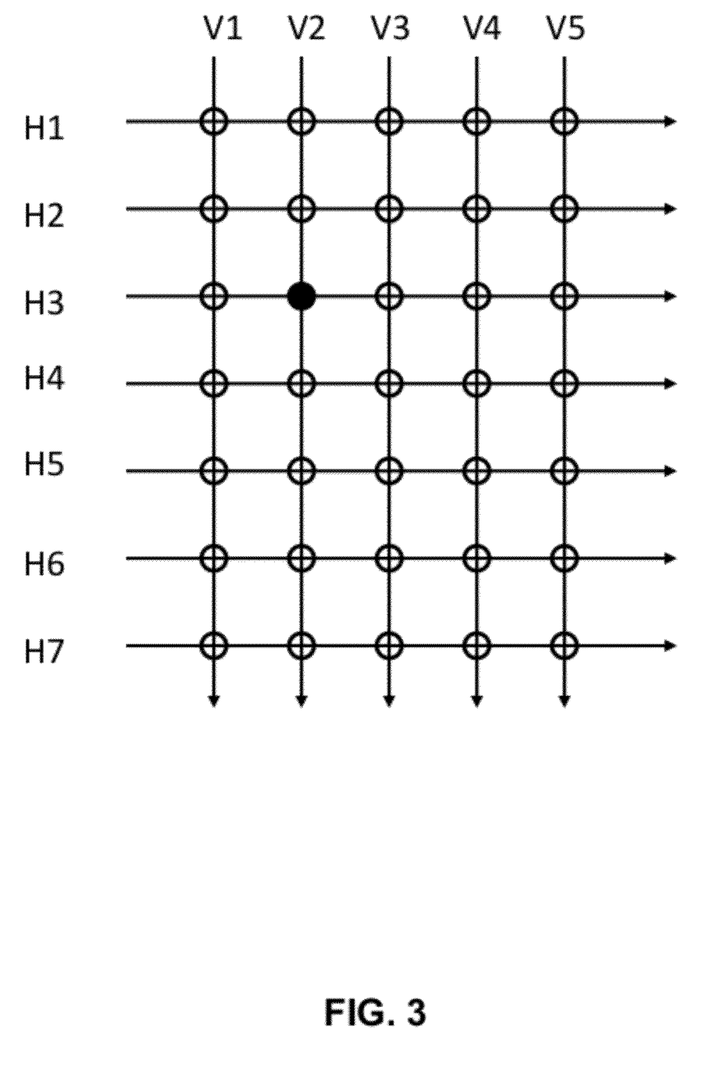
FIG. 3 illustrates an example of scan chain diagnosis involving one defective scan cell.

Two-dimensional scan architecture may allow fast identification of defective scan cells without using scan patterns. FIG. 3 illustrates an example of scan chain diagnosis involving one defective scan cell. Scan cells are named by their coordinates corresponding to horizontal and vertical scan chains (scan paths). In the figure, the scan cell (H3, V2), at the intersection of scan chain H3 and V2, is the defective scan cell. Chain pattern tests along horizontal and vertical scan paths should identify H3 and V2 as faulty scan chains. The defective scan cell (H3, V2) can be readily determined based on the two identified faulty scan chains.

Figure 4:
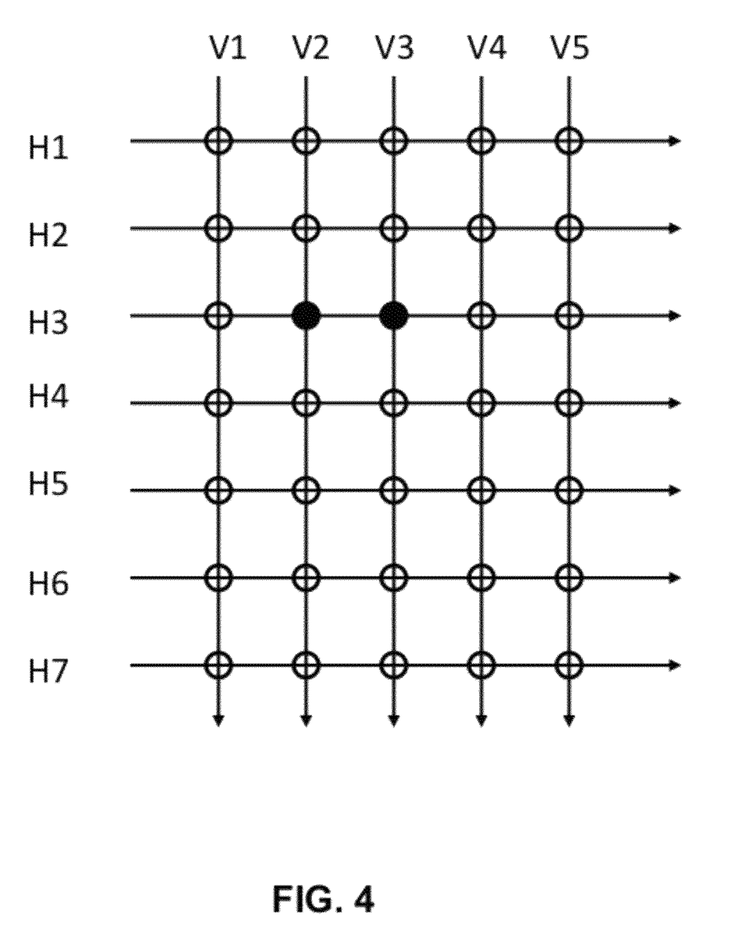
FIG. 4 illustrates an example of scan chain diagnosis involving two defective scan cells that can be located using a set of horizontal scan paths and a set of vertical scan paths.

If two defective scan cells are present, two sets of scan paths used in FIG. 3 may work in some cases. FIG. 4 illustrates such an example. A chain pattern test along horizontal and vertical scan paths will identify three faulty scan chains: H3, V2 and V3. Accordingly, the two scan cells (H3, V2) and (H3, V3) at the intersection of these three faulty scan chains will be diagnosed as the defective cells.

Figure 5:
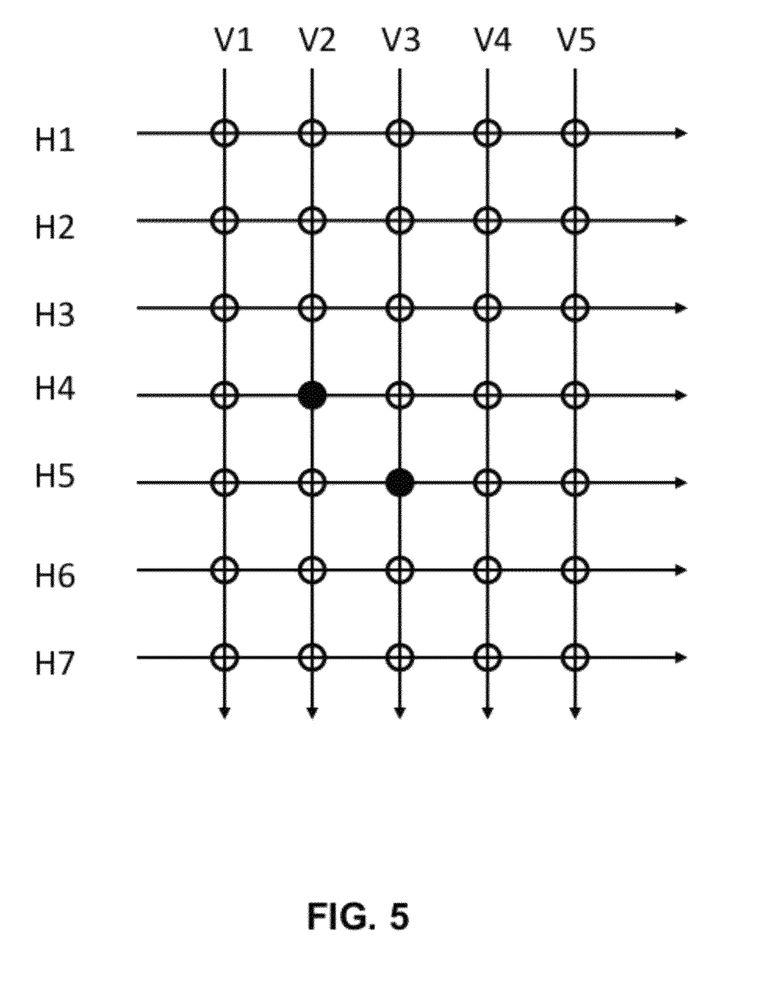
FIG. 5 illustrates an example of scan chain diagnosis involving two defective scan cells that cannot be located using a set of horizontal scan paths and a set of vertical scan paths.

In some other cases involving two defective scan cells, two sets of scan paths may not be sufficient. FIG. 5 illustrates such an example. In this case, four faulty scan chains, H4, H5, V2 and V3, may be determined by a chain pattern test with horizontal and vertical scan paths. However, the test cannot pinpoint the defective scan cells, (H4, V2) and (H5, V3) because scan cells (H4, V3) and (H5, V2) can also result in the four faulty scan chains.

Figure 7:
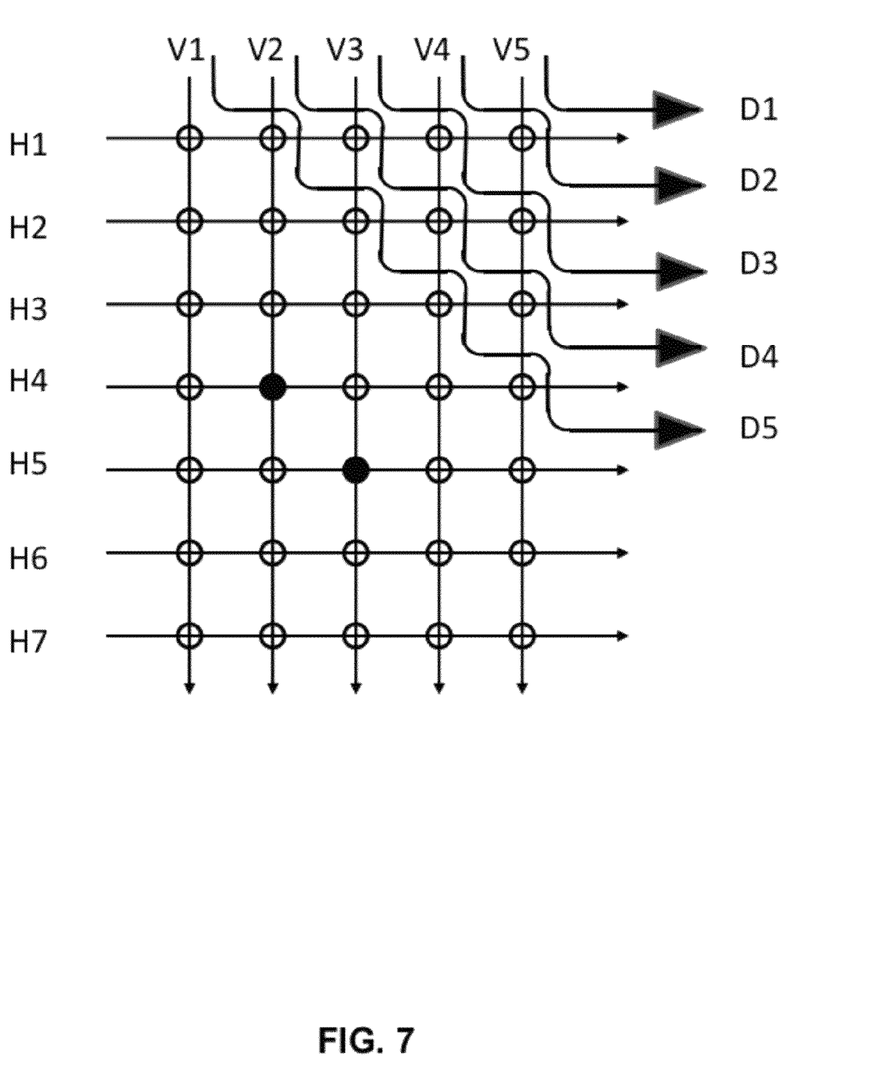
FIG. 7 illustrates additional quasi-diagonal scan paths for the set of quasi-diagonal scan paths shown in FIG. 6.

To improve the diagnosis resolution, a third set of scan paths may be employed. FIG. 6 illustrates an example of quasi-diagonal scan paths D1, D2, D3 and D4. These paths follow in general a diagonal direction from the up left corner to the lower right corner. Nevertheless, they are not true diagonal paths because they are formed by a series of segments each of which comprises a horizontal shift followed a vertical shift. To cover all scan cells, the quasi-diagonal scan paths may include ones formed by a series of segments each of which comprises a vertical shift followed a horizontal shift. The scan paths D1-D5 illustrated in FIG. 7 are examples.

Applying the quasi-diagonal scan paths to the example in FIG. 5 should reveal two additional faulty scan chains, D2 and D3. Combining this result with those for the horizontal and vertical scan paths, the two defective scan cells (H4, V2) and (H5, V3) can be determined. Scan cells (H4, V3) and (H5, V2) are on good (not faulty) quasi-diagonal scan paths D1 and D4, respectively. These two scan cells should be defect-free.

Figure 11:
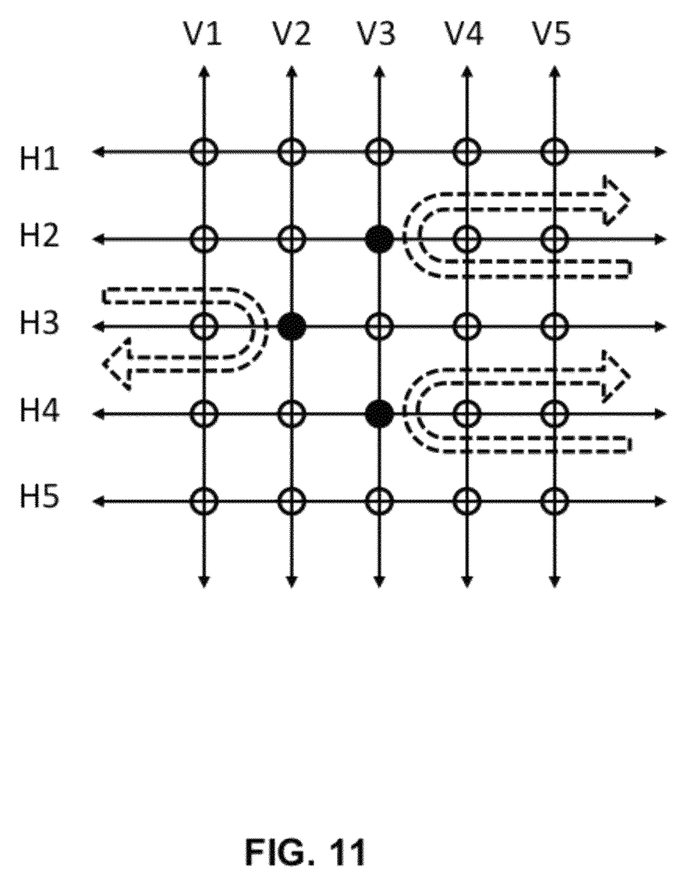
FIG. 11 an example of using the scan cell network in FIG. 10 to locate three defective scan cells.

It is known in the art that (t+1) orthogonal sets of scan paths are needed for diagnosing t defective cells with a perfect resolution. Two sets of scan paths are orthogonal if each scan path in one set overlaps in at most one scan cell with any scan paths in the other set. The set of horizontal scan paths and the set of vertical scan paths are orthogonal, but not orthogonal to the set of quasi-diagonal scan paths shown in FIGS. 6 and 7 as two scan cells are at each of the intersections. While these three sets of scan paths can be used to identify two defective scan cells in FIG. 5, this may not work in some other cases involving two defective scan cells. FIG. 11 illustrates such an example (considering defective scan cells (H3, V2) and (H2, V3) only) which will be discussed in detail below.

Figure 8:
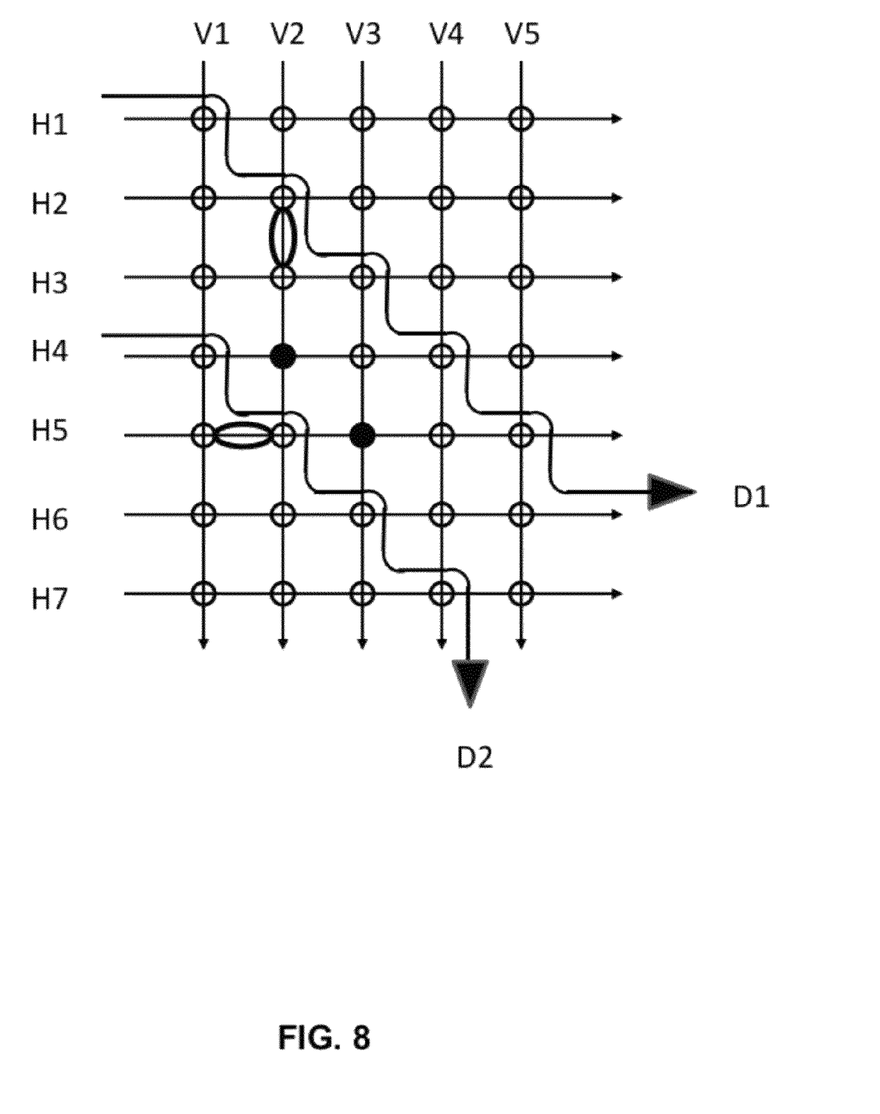
FIG. 8 illustrates an example of two interconnection defects that can be located with horizontal, vertical and quasi-diagonal scan paths.

In addition to scan cells, interconnections between scan cells may also be defective. The above three sets of scan paths may be used to diagnose such interconnection defects. FIG. 8 illustrates an example of two interconnection defects. One interconnection defect lies between scan cells (H2, V2) and (H3, V2), while the other lies between (H5, V1) and (H5, V2). A chain pattern test will show only four faulty scan chains H5, V2, D1, and D2. Based on information of the faulty and good scan chains, the defective interconnections can be located.

Figure 9:
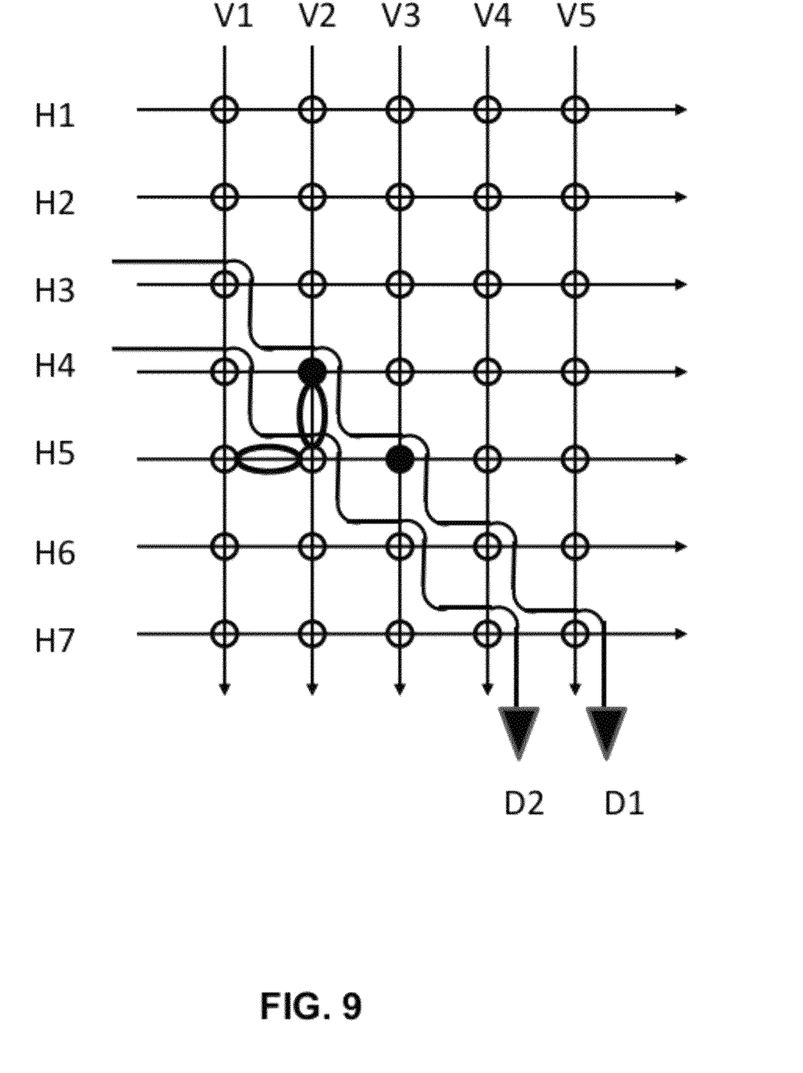
FIG. 9 illustrates an example of two defective interconnections cannot be located but can only be identified as defect candidates by horizontal, vertical and quasi-diagonal scan paths.

FIG. 9 illustrates an example of two defective interconnections that cannot be located but can only be identified as defect candidates by horizontal, vertical and quasi-diagonal scan paths. In the figure, one interconnection defect lies between scan cells (H5, V1) and (H5, V2), while the other lies between (H4, V2) and (H5, V2). Besides these two interconnection defect candidates, the scan cell (H5, V2) is also a defect candidate because all failed scan paths pass through it.

The input of each scan cell in the above examples are coupled to either outputs of two scan cells, output of one scan cell and a primary input of the circuit, or two primary inputs. Scan paths different from the above three sets of scan paths may be constructed by choosing different selector signal combinations. Alternatively, additional sets of scan paths may be constructed based on coupling more than two scan cells/primary inputs to the input of a scan cell.

Figure 10:
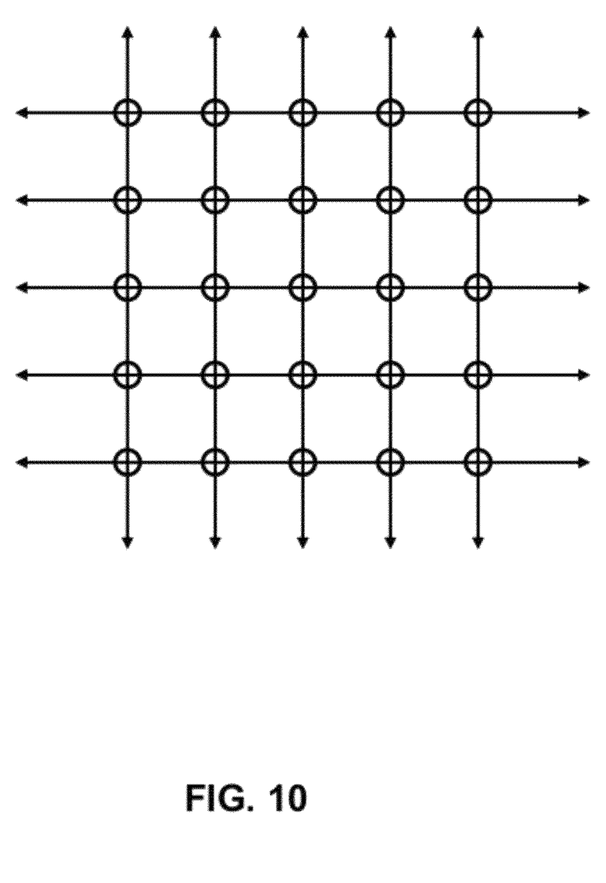
FIG. 10 illustrates an example of a scan cell network constructed by using the 4-to-1 multiplexers.

As noted before, the 4-to-1 multiplexer 130 in FIG. 1b allows the scan cell 140 to select signals from four inputs, $Sl_1$, $Sl_2$, $Sl_3$ and $Sl_4$ based on two selection signals. FIG. 10 illustrates an example of a scan cell network constructed by using the 4-to-1 multiplexers. The input for each of the scan cells in the middle part is coupled to outputs of four surrounding scan cells through a 4-to-1 multiplexer. This scan cell network makes it easy to design various sets of scan paths.

FIG. 11 illustrates an example of using the scan cell network in FIG. 10 to locate three defective scan cells. In the figure, scan cells (H2, V3), (H3, V2), and (H4, V3) are defective. Using the previous three sets of scan paths: horizontal, vertical and quasi-diagonal, the above three defective scan cells along with (H2, V2) and (H3, V3) are determined to be defect scan cell candidates even in the absence of the defective scan cell (H4, V3). Scan cells (H2, V2) and (H3, V3) are masked by (H2, V3) and (H3, V2) in the previous scan cell network as any pattern that shifts along the three sets of scan paths through (H2, V2) or (H3, V3) will pass through either (H2, V3) or (H3, V2).

The scan cell network in FIG. 11, however, allows the three defective scan cells to be located. One approach begins with using the previous horizontal and vertical scan paths to identify faulty scan chains: H2, H3, H4, V2, and V3. Then, another set of scan paths as illustrated by dotted arrow lines in FIG. 11 is applied. The scan paths in this set reverse their scan directions once reaching the targeted scan cells and thus are referred to as reverse scan paths. The application of the set of reverse scan paths can distinguish the good (defect-free) scan cells (H2, V2) and (H3, V3) from the defective scan cells (H2, V3) and (H3, V2). The scan cell (H2, V2) may also be determined to be a good scan cell by using another set of quasi-diagonal scan paths that run from the up right corner to the lower left corner.

In general, for N-way scan cell connection, when the reversing shift directions are available in each direction, up to N defective scan cells may be diagnosed with perfect diagnosis resolution. To prove it, assume there are N defective scan cells in an N-way scan cell connection network. For each defective scan cell, at most (N−1) of its neighboring scan cells are defective, i.e. at least one neighboring scan cell is defect-free. A chain test pattern can go through this defect-free neighboring cell to reach a defective scan cell and then reverse the shift direction to shift the values out similar to the examples illustrated in FIG. 11. Since the reverse shift direction is available for each scan cell in each direction, all scan cells can be proved to be defective or defect-free by applying a chain test pattern with reversing shift directions.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of scan chain diagnosis, comprising:
   loading a two-dimensional scan cell network with a first set of chain patterns along a first set of scan paths;
   unloading the two-dimensional scan cell network along the first set of scan paths to collect first chain test data;
   loading the two-dimensional scan cell network with a second set of chain patterns along a second set of scan paths, wherein the second set of scan paths comprises quasi-diagonal scan paths, reverse scan paths, or orthogonal scan paths and shares at least one scan cell with the first set of scan paths; and
   unloading the two-dimensional scan cell network along the second set of scan paths to collect second chain test data.

2. The method recited in claim 1, further comprising:
   identifying one or more defective scan cells or defective scan cell candidates based on the first chain test data and the second chain test data.

3. The method recited in claim 1, further comprising:
   loading the two-dimensional scan cell network with a third set of chain patterns along a third set of scan paths; and
   unloading the two-dimensional scan cell network along the third set of scan paths to collect third chain test data.

4. The method recited in claim 3, further comprising:
   identifying one or more defective scan cells or defective scan cell candidates based on the first chain test data, the second chain test data and the third chain test data.

5. The method recited in claim 1, wherein an input for a scan cell in the two-dimensional scan cell network is coupled to a multiplexer having inputs that are coupled to: (a) at least two primary inputs; (b) one primary input and an output from at least one other scan cell in the two-dimensional scan cell network; or (c) outputs from at least two other scan cells in the two-dimensional scan cell network.

6. The method recited in claim 5, wherein the multiplexer is a 2-to-1 multiplexer.

7. The method recited in claim 5, wherein the multiplexer is a 4-to-1 multiplexer.

8. A circuit comprising a two-dimensional scan cell network, the two-dimensional scan cell network comprising:
   at least one primary input scan cell comprising an input coupled to receive a value from at least one primary input; and
   at least one core scan cell comprising an input coupled to an output of a multiplexer, the multiplexer having inputs coupled directly to outputs of two or more other scan cells in the two-dimensional scan cell network, wherein the two or more other scan cells comprise: (a) primary input scan cells of the at least one primary input scan cell; or (b) a primary input scan cell of the least one primary input scan cell and another core scan cell in the two-dimensional scan cell network;

wherein the two-dimensional scan cell network is arranged such that at least one selection signal at the at least one primary input causes a test pattern to be shifted along one of at least two available scan paths, wherein the at least two available scan paths are selectable by the at least one selection signal, wherein the at least two available scan paths comprise a first set of scan paths and a second set of scan paths, and wherein the second set of scan paths comprises quasi-diagonal scan paths, reverse scan paths, or orthogonal scan paths and shares at least one scan cell with the first set of scan paths.

9. The circuit recited in claim 8, wherein the multiplexer is a 2-to-1 multiplexer.

10. The circuit recited in claim 8, wherein the multiplexer is a 4-to-1 multiplexer.

11. A circuit comprising:

a two-dimensional scan cell network, the two-dimensional scan cell network comprising:

a scan cell comprising an input coupled to an output of a multiplexer, the multiplexer comprising multiplexer inputs and at least one selector input, the multiplexer inputs being respectively coupled directly to:
  (a) at least two primary inputs, or
  (b) one primary input and an output from at least one other scan cell in the scan cell network:, the two-dimensional scan cell network being arranged such that at least one selection signal at the at least one selector input causes a test pattern to be shifted along one of at least two available scan paths, wherein the at least two available scan paths are selectable by the at least one selection signal, wherein the at least two available scan paths comprise a first set of scan paths and a second set of scan paths, and wherein the second set of scan paths comprises quasi-diagonal scan paths, reverse scan paths, or orthogonal scan paths and shares at least one scan cell with the first set of scan paths.

12. A non-transitory computer readable storage medium storing computer-readable instructions that, when executed by a computer, cause the computer to implement a circuit, the circuit comprising:

a two-dimensional scan cell network, the two-dimensional scan cell network comprising:

a scan cell comprising an input coupled to an output of a multiplexer, the multiplexer comprising multiplexer inputs and at least one selector input, the multiplexer inputs respectively coupled directly to:
  (a) at least two primary inputs, or
  (b) one primary input and output from at least one other scan cell in the scan cell network;

the two-dimensional scan cell network being arranged such that at least one selection signal at the at least one selector input causes a test pattern to be shifted along one of at least two available scan paths, wherein the at least two available scan paths are selectable by the at least one selection signal, wherein the at least two available scan paths comprises a first set of scan paths and a second set of scan paths, and wherein the second set of scan paths comprises quasi-diagonal scan paths, reverse scan paths, or orthogonal scan paths and shares at least one scan cell with the first set of scan paths.

13. A system, comprising:

means for loading a two-dimensional scan cell network with a first set of chain patterns along a first set of scan paths;

means for unloading the two-dimensional scan cell network along the first set of scan paths to collect first chain test data;

means for loading the two-dimensional scan cell network with a second set of chain patterns along a second set of scan paths, wherein the second set of scan paths comprises quasi-diagonal scan paths, reverse scan paths, or orthogonal scan paths and shares at least one scan cell with the first set of scan paths; and means for unloading the two-dimensional scan cell network along the second set of scan paths to collect second chain test data.

\* \* \* \* \*